US009817738B2

(12) United States Patent
Ramanujan et al.

(10) Patent No.: US 9,817,738 B2
(45) Date of Patent: Nov. 14, 2017

(54) CLEARING POISON STATUS ON READ ACCESSES TO VOLATILE MEMORY REGIONS ALLOCATED IN NON-VOLATILE MEMORY

(71) Applicant: Intel Corporation, Santa Clara, CA (US)

(72) Inventors: Raj K. Ramanujan, Federal Way, WA (US); Camille C. Raad, Folsom, CA (US); Richard P. Mangold, Forest Grove, OR (US); Theodros Yigzaw, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 14/845,503

(22) Filed: Sep. 4, 2015

(65) Prior Publication Data

US 2017/0068537 A1  Mar. 9, 2017

(51) Int. Cl.
*G06F 11/30* (2006.01)
*G06F 11/07* (2006.01)
*G06F 11/16* (2006.01)
*G11C 29/42* (2006.01)
(Continued)

(52) U.S. Cl.
CPC ........ *G06F 11/3037* (2013.01); *G06F 11/073* (2013.01); *G06F 11/167* (2013.01); *G06F 11/1612* (2013.01); *G11C 29/42* (2013.01); *G11C 29/52* (2013.01); *G11C 2029/0411* (2013.01)

(58) Field of Classification Search
CPC ........ G06K 2215/0085; G06F 12/1425; G06F 11/10; G06F 11/1048; G06F 11/1056; H04L 9/3247; H04L 2209/20
See application file for complete search history.

(56) References Cited

U.S. PATENT DOCUMENTS 5,715,260 A * 2/1998 Black .................... H04L 69/04
714/704
5,948,116 A * 9/1999 Aslanidis ............. H04L 1/0057
714/746
(Continued)

FOREIGN PATENT DOCUMENTS

WO   03001380 A2   1/2003

OTHER PUBLICATIONS

International Search Report and Written Opinion for International Patent Application No. PCT/US2016/041975, mailed Oct. 21, 2016, 11 pages.

*Primary Examiner* — Loan L. T. Truong
(74) *Attorney, Agent, or Firm* — Jordan IP Law, LLC

(57) ABSTRACT

Systems and methods may provide for detecting that a read operation is directed to a memory region while the memory region is in a poisoned state and clearing the poisoned state if volatile data stored in the memory region does not correspond to a known data pattern. Additionally, the memory region may be maintained in the poisoned state if the volatile data stored in the memory region corresponds to the known data pattern. In one example, an error may be detected, wherein the error is associated with a write operation directed to the memory region. In such a case, the poisoned state may be set for the volatile data in response to the error and the known data pattern may be written to the memory region.

24 Claims, 2 Drawing Sheets

(51) Int. Cl.
*G11C 29/52* (2006.01)
*G11C 29/04* (2006.01)

(56) References Cited

U.S. PATENT DOCUMENTS

| | | | | |
|---|---|---|---|---|
| 6,594,785 | B1* | 7/2003 | Gilbertson | G06F 11/0712 714/31 |
| 7,353,433 | B2* | 4/2008 | Vaid | G06F 11/0781 714/54 |
| 8,245,087 | B2 | 8/2012 | Abts et al. | |
| 8,612,676 | B2* | 12/2013 | Dahlen | G06F 12/0893 711/113 |
| 9,052,835 | B1* | 6/2015 | Darrington | G06F 3/0659 |
| 2003/0133336 | A1* | 7/2003 | Chen | G11C 29/44 365/200 |
| 2003/0200394 | A1* | 10/2003 | Ashmore | G06F 11/1658 711/119 |
| 2005/0015672 | A1* | 1/2005 | Yamada | G06F 11/0793 714/38.13 |
| 2006/0007763 | A1* | 1/2006 | Gelencser | G11C 29/44 365/200 |
| 2006/0075301 | A1* | 4/2006 | Fossum | G06F 9/3824 714/38.13 |
| 2006/0277398 | A1* | 12/2006 | Akkary | G06F 9/3814 712/245 |
| 2007/0226579 | A1* | 9/2007 | Alexander | G06F 11/106 714/758 |
| 2008/0155375 | A1* | 6/2008 | Vera | G06F 11/1008 714/758 |
| 2009/0132876 | A1* | 5/2009 | Freking | G06F 11/106 714/723 |
| 2009/0327638 | A1* | 12/2009 | Buch | G06F 11/073 711/166 |
| 2011/0078492 | A1* | 3/2011 | Kumar | G06F 12/0817 714/5.11 |
| 2011/0271152 | A1* | 11/2011 | Hattori | G06F 11/079 714/53 |
| 2012/0023364 | A1 | 1/2012 | Swanson et al. | |
| 2012/0221774 | A1* | 8/2012 | Atkisson | G06F 12/0802 711/103 |
| 2013/0061094 | A1* | 3/2013 | Busch | G06F 11/2215 714/27 |
| 2013/0159818 | A1* | 6/2013 | O'Connor | G06F 13/4239 714/799 |
| 2013/0275817 | A1* | 10/2013 | Bancel | G06F 11/0751 714/54 |
| 2014/0006879 | A1* | 1/2014 | Rangarajan | G06F 11/004 714/48 |
| 2014/0006904 | A1* | 1/2014 | Gendler | G06F 11/1012 714/773 |
| 2014/0136915 | A1 | 5/2014 | Hyde et al. | |
| 2014/0157054 | A1 | 6/2014 | Yoon et al. | |
| 2014/0189417 | A1* | 7/2014 | Hum | G06F 11/004 714/2 |
| 2014/0223226 | A1* | 8/2014 | Yigzaw | G06F 11/1064 714/15 |
| 2014/0237305 | A1* | 8/2014 | Rehmeyer | G11C 29/70 714/704 |
| 2015/0278016 | A1* | 10/2015 | La Fetra | H04L 1/0045 714/766 |

* cited by examiner

FIG. 1
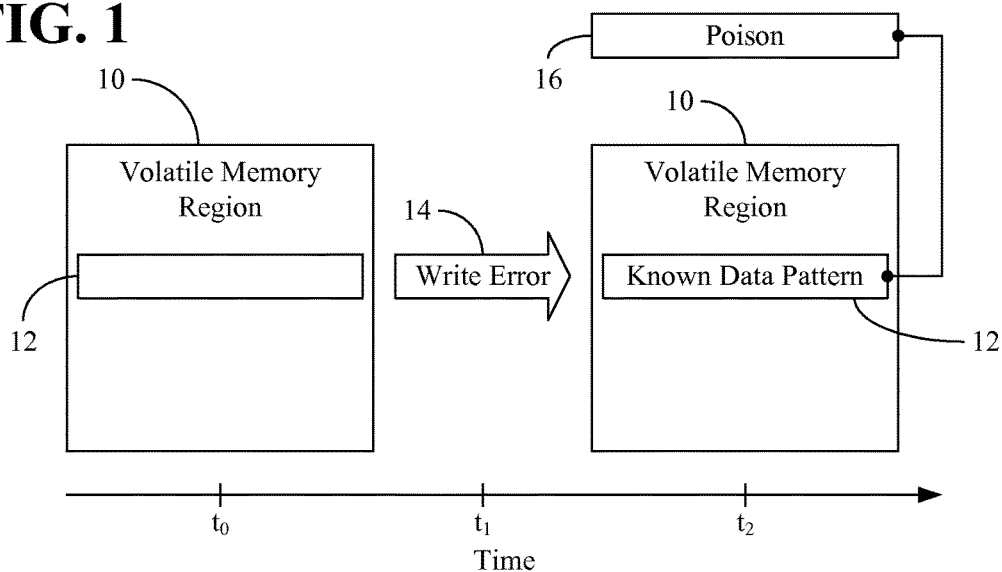
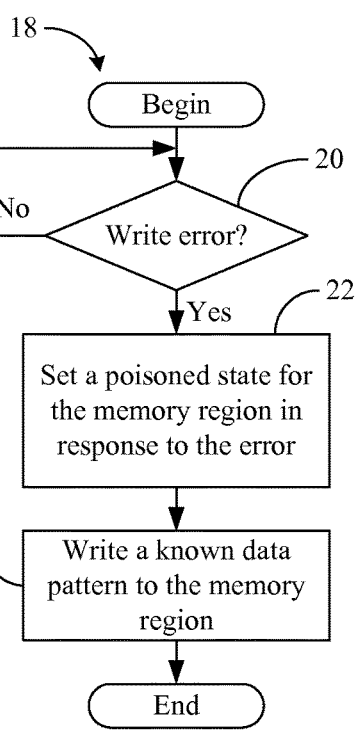
FIG. 2A
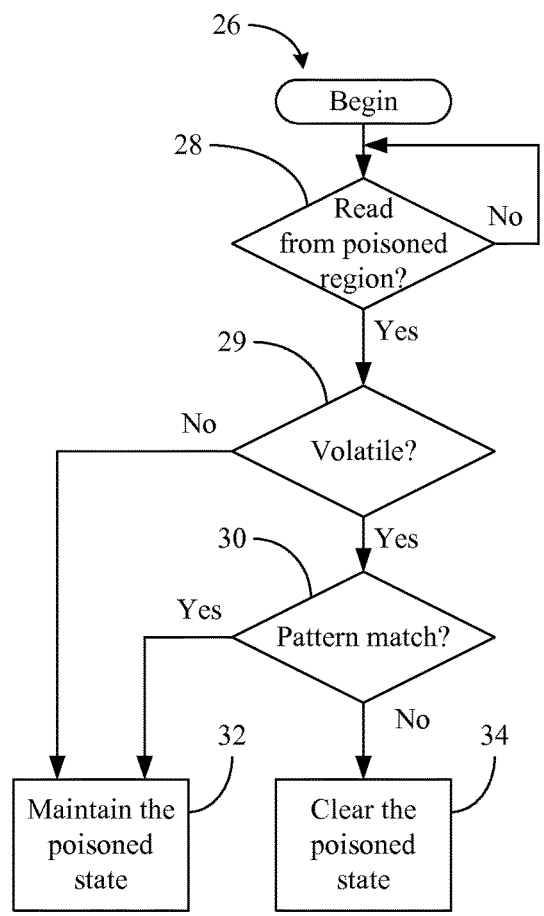
FIG. 2B

CLEARING POISON STATUS ON READ ACCESSES TO VOLATILE MEMORY REGIONS ALLOCATED IN NON-VOLATILE MEMORY

TECHNICAL FIELD

Embodiments generally relate to memory structures. More particularly, embodiments relate to clearing poison status on read accesses to volatile memory regions allocated in non-volatile memory.

BACKGROUND

When internal data corruptions are detected in conventional volatile memory, a "poison" state may be set in metadata corresponding to the impacted region (e.g., cache line) of memory to ensure that the corrupted data is not used in future operations. If power is subsequently removed from the volatile memory (e.g., due to a system reset), the poison state may be cleared because the corrupted data may be automatically lost from the impacted memory region the due to the volatile nature of the memory.

BRIEF DESCRIPTION OF THE DRAWINGS

The various advantages of the embodiments will become apparent to one skilled in the art by reading the following specification and appended claims, and by referencing the following drawings, in which:

FIG. 1 is an illustration of an example of a volatile memory region according to an example;

FIG. 2A is a flowchart of an example of a method of handling data corruptions according to an embodiment;

FIG. 2B is a flowchart of an example of a method of handling read accesses according to an embodiment;

DESCRIPTION OF EMBODIMENTS

Figure 3:
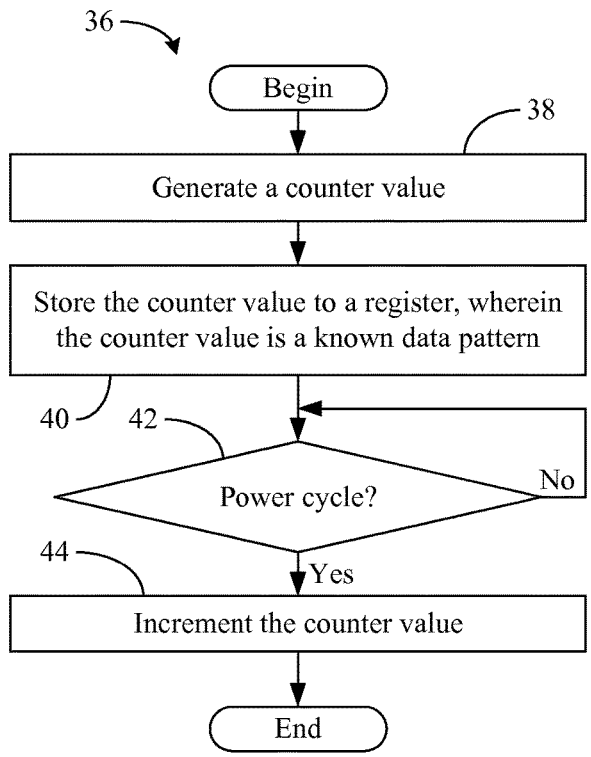
FIG. 3 is a flowchart of an example of a method of managing a known data pattern according to an embodiment.

Recent developments in memory architectures may provide for non-volatile memory (NVM) that is used to store volatile data. The volatile data may include, for example, data used by an application or operating system, that the application or operating system considers to be stored in a volatile memory and is no longer stored in the volatile memory after a system reset. Examples of NVM may include, for example, phase change memory (PCM), three dimensional cross point memory, resistive memory, nanowire memory, ferro-electric transistor random access memory (FeTRAM), flash memory such as NAND or NOR, magnetoresistive random access memory (MRAM) memory that incorporates memristor technology, spin transfer torque (STT)-MRAM, and so forth. Poison states may typically be cleared for NVM structures only when re-initializations occur (e.g., during manufacturing or reformatting). In such a case, a poison state that has been set for volatile data stored within the NVM may remain after a system reset even though the loss of power may have effectively cleared the underlying data corruption. As a result, regions of volatile memory may appear to be corrupted when they are in fact usable. Techniques described herein may eliminate such a condition.

Turning now to FIG. 1, a volatile memory region 10 is shown, wherein the volatile memory region 10 may generally be used as, for example, dynamic random access memory (DRAM), static RAM (SRAM) or other suitable memory structure that does not have a persistency requirement. In one example, the memory region 10 is a physical volatile memory that is part of a two level memory (2LM) or is a portion of a NVM used to emulate operation of a volatile memory after a system reset. The 2LM may include, for example, cached subsets of system disk level storage in addition to, for example, run-time data. The illustrated volatile memory region 10 has an area 12 (e.g., cache line) that contains either no data or valid data at time $t_0$. An error 14 associated with a write operation may occur at time $t_1$, wherein the error 14 may cause a poison state 16 to be set for the volatile memory region 10 at time $t_2$. The poison state 16 may be set, for example, by toggling a bit and/or field in metadata corresponding to the area 12 in the volatile memory region 10. The error 14 may also cause a known data pattern (e.g., a "poison pattern") to be automatically written to the area 12 (e.g., replacing the corrupt data) at time $t_2$. As will be discussed in greater detail below, incrementing the known data pattern on each power cycle may enable the poison state 16 to be subsequently cleared even if the volatile memory region 10 is allocated within a non-volatile memory structure and no re-initialization has taken place. As a result, more efficient memory usage may be achieved.

FIG. 2A shows a method 18 of handling data corruptions such as, for example, the write error 14 (FIG. 1), already discussed. The method 18 may be implemented in one or more modules as a set of logic instructions stored in a machine- or computer-readable storage medium such as RAM, read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof. For example, computer program code to carry out operations shown in method 18 may be written in any combination of one or more programming languages, including an object oriented programming language such as JAVA, SMALLTALK, C++ or the like and conventional procedural programming languages, such as the "C" programming language or similar programming languages.

Illustrated processing block 20 determines whether an error has been detected, wherein the error is associated with a write operation directed to a memory region (e.g., non-volatile/persistent memory region, volatile memory region allocated in non-volatile/persistent memory, etc.). If so, block 22 may set a poisoned state for the memory region in response to the error. Block 22 may include toggling a bit and/or field in metadata corresponding to the memory region. Additionally, illustrated block 24 writes a known data pattern to the memory region. Block 24 may include, for example, repeating the write of a 64-bit known data pattern across a 64B cache line. The known data pattern may be incremented or otherwise changed in a known fashion on each power cycle. Additionally, if a write error is not detected at block 20, the illustrated method 18 repeats.

FIG. 2B shows a method 26 of handling read accesses. The method 26 may also be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 28 may provide for determining whether a read operation has been detected, wherein the read operation is directed to a memory region that is in a poisoned state. Block 28 may therefore include accessing metadata corresponding to the memory region in question. If a read from a poisoned region is detected at block 28, a determination may be made at block 29 as to whether the memory region is a volatile memory region. If the memory region is not a volatile memory region (e.g., non-volatile/persistent memory region), the memory region may be maintained in the poisoned state at block 32. Otherwise, a determination may be made at block 30 as to whether data stored in the volatile memory region corresponds to (e.g., matches) a known data pattern. If so, it may be inferred that a power cycle has not taken place after the volatile memory region was poisoned and illustrated block 32 maintains the volatile memory region in the poisoned state. If, on the other hand, it is determined at block 34 that the data stored in the volatile memory region does not correspond to the known data pattern, then block 34 may clear the poisoned state (e.g., inferring that a power cycle has taken place after the volatile memory region was poisoned). If a read from a poisoned region is not detected at block 28, the illustrated method 26 repeats.

Turning now to FIG. 3, a method 36 of managing a known data pattern is shown. The method 36 may also be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 38 provides for generating a counter value such as, for example, a 64-bit poison pattern, wherein the counter value is a known data pattern. The counter value may be stored to a register such as, for example, a control-status register (CSR) at block 40. The register may be error correction code (ECC) protected so that an error in the register does not mask out the counter value. Illustrated block 42 determines whether a power cycle (e.g., system reset) has been detected. If so, the counter value may be incremented (e.g., monotonically increased) or otherwise changed by a known amount at block 44. Thus, in the case of a monotonically increased 64-bit poison pattern, the chance of data matching the pattern (e.g., a false positive) would be $2^{64}$. The power cycle determination at block 42 may repeat until a power cycle is detected. Other approaches to generating and maintaining the known data pattern may also be used.

Figure 4:
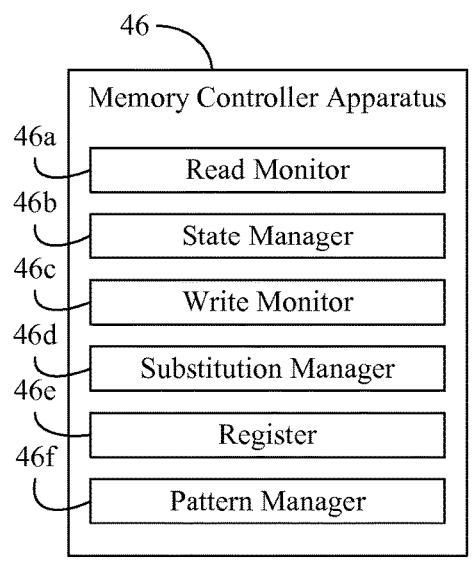
FIG. 4 is a block diagram of an example of a memory controller apparatus according to an embodiment.

FIG. 4 shows a memory controller apparatus 46 (46a-46f) that may be used to support an error-protected computing system. The memory controller apparatus 46 may generally implement one or more aspects of the method 18 (FIG. 2A), the method 26 (FIG. 2B) and/or the method 36 (FIG. 3), already discussed. In the illustrated example, a read monitor 46a detects that a read operation is directed to a volatile memory region while the volatile memory region is in a poisoned state. Additionally, the apparatus 46 may also include a state manager 46b that clears the poisoned state if volatile data stored in the memory region does not correspond to a known data pattern and maintains the memory region in the poisoned state if the volatile data stored in the memory region corresponds to the known data pattern.

In one example, a write monitor 46c detects an error associated with a write operation directed to the volatile memory region, wherein the state manager 46b may set the poisoned state for the volatile memory region in response to the error. Moreover, a substitution manager 46d may write the known data pattern to the volatile memory region. Additionally, the apparatus 46 may include a register 46e (e.g., ECC protected CSR) and a pattern manager 46f that generates a counter value and stores the counter value to the register 46e as the known data pattern. The pattern manager 46f may also increment the counter value stored in the register 46e in response to power cycles.

Figure 5:
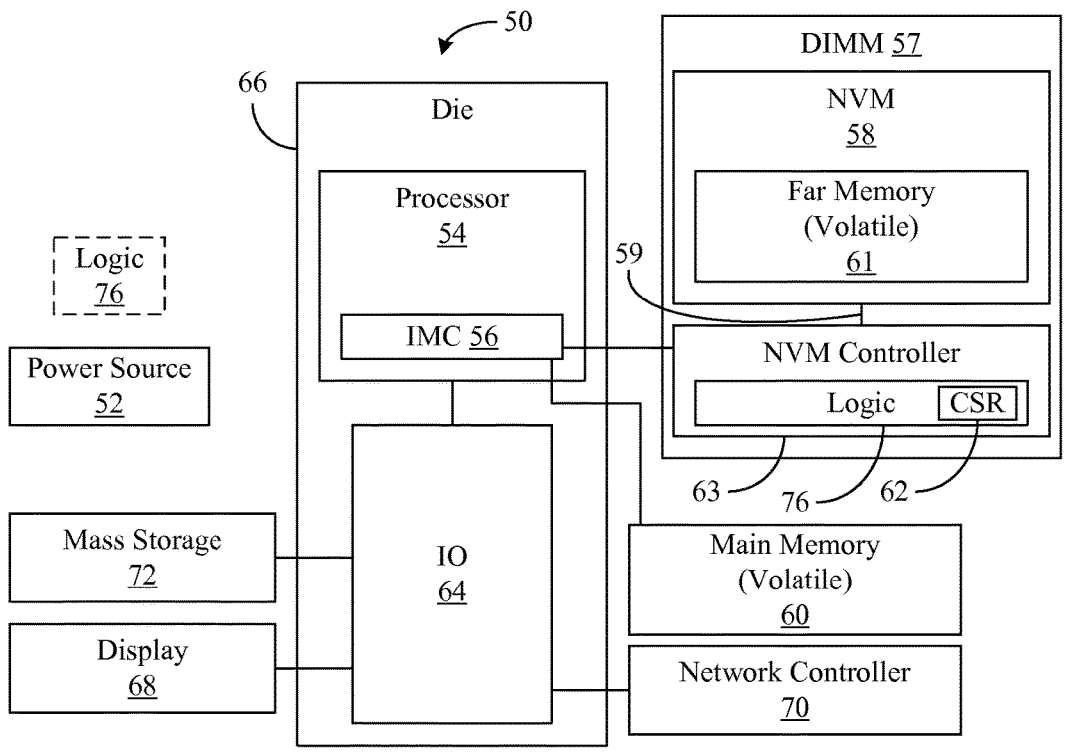
FIG. 5 is a block diagram of an example of a computing system according to an embodiment.

FIG. 5 shows an error-protected computing system 50. The computing system 50 may generally be part of an electronic device/platform having computing functionality (e.g., personal digital assistant/PDA, notebook computer, tablet computer, server), communications functionality (e.g., smart phone), imaging functionality, media playing functionality (e.g., smart television/TV), wearable functionality (e.g., watch, eyewear, headwear, footwear, jewelry), vehicular functionality (e.g., car, truck, motorcycle), etc., or any combination thereof. In the illustrated example, the system 50 includes a power source 52 to supply power to the system 50 and a processor 54 having an integrated memory controller (IMC) 56 that is coupled to main memory 60 (e.g., volatile "near" memory). The IMC 56 may also be coupled to another memory module 57 (e.g., dual inline memory module/DIMM) containing a non-volatile memory structure such as, for example, NVM 58. The NVM 58 may include "far" memory 61, which may also be used to store volatile data. Thus, the far memory 61 and the main memory 60 may function as a 2LM structure, wherein the main memory 60 generally serves as a low-latency and high-bandwidth cache of the far memory 61, which may have considerably lower bandwidth and higher latency.

The NVM 58 may include, for example, PCM, three dimensional cross point memory, resistive memory, nanowire memory, FeTRAM, flash memory such as NAND or NOR, MRAM that incorporates memristor technology, STT-MRAM, and so forth. As already noted, the memory module 57 may include, for example, volatile DRAM configured as one or more memory modules such as, for example, DIMMs, small outline DIMMs (SODIMMs), etc.

The illustrated system 50 also includes an input output (IO) module 64 implemented together with the processor 54 on a semiconductor die 66 as a system on chip (SoC), wherein the IO module 64 functions as a host device and may communicate with, for example, a display 68 (e.g., touch screen, liquid crystal display/LCD, light emitting diode/LED display), a network controller 70, and mass storage 72 (e.g., hard disk drive/HDD, optical disk, flash memory, etc.). The memory module 57 may include an NVM controller 63 having logic 76 that is connected to the far memory 61 via an internal bus 59 or other suitable interface. The illustrated logic 76 detects read operations directed to memory regions of the far memory 61 while the memory regions are in a poisoned state, clears the poisoned states if volatile data stored in the memory regions does not correspond to a known data pattern, and maintains the memory regions in the poisoned state if the volatile data stored in the memory regions corresponds to the known data pattern. Thus, the NVM controller 63 may have similar functionality to that of the memory controller apparatus 46 (FIG. 4), already discussed. For example, logic 76 may also include a CSR 62 (e.g., single error correction and double error detection/SECDED ECC protected register), wherein the known data pattern may be stored in the CSR 62 as a counter value that increments with each power cycle. Additionally, the logic 76 may optionally be implemented elsewhere in the system 50.

Additional Notes and Examples

Example 1 may include an error-protected computing system comprising a memory structure containing a memory region, a bus coupled to the memory structure and a memory controller apparatus coupled to the bus, the memory controller apparatus including a read monitor to detect that a read operation is directed to the memory region while the memory region is in a poisoned state and a state manager to clear the poisoned state if volatile data stored in the memory region does not correspond to a known data pattern and maintain the memory region in the poisoned state if the volatile data stored in the memory region corresponds to the known data pattern.

Example 2 may include the system of Example 1, wherein the memory controller apparatus further includes a write monitor to detect an error associated with a write operation directed to the memory region, wherein the state manager is to set the poisoned state for the volatile memory region in response to the error, and a substitution manager to write the known data pattern to the memory region.

Example 3 may include the system of any one of Examples 1 or 2, further including a control-status register and a pattern manager to generate a counter value and store the counter value to the control-status register, wherein the counter value is the known data pattern.

Example 4 may include the system of Example 3, wherein the control-status register is error correction code protected.

Example 5 may include the system of Example 3, wherein the pattern manager is to increment the counter value in response to a power cycle.

Example 6 may include the system of Example 1, wherein the memory structure is a non-volatile memory structure.

Example 7 may include a memory controller apparatus comprising a read monitor to detect that a read operation is directed to a memory region while the memory region is in a poisoned state and a state manager to clear the poisoned state if volatile data stored in the memory region does not correspond to a known data pattern and maintain the region in the poisoned state if the volatile data stored in the memory region corresponds to the known data pattern.

Example 8 may include the apparatus of Example 7, further including a write monitor to detect an error associated with a write operation directed to the memory region, wherein the state manager is to set the poisoned state for the volatile data in response to the error, and a substitution manager to write the known data pattern to the memory region.

Example 9 may include the apparatus of any one of Examples 7 or 8, further including a pattern manager to generate a counter value and store the counter value to a control-status register, wherein the counter value is the known data pattern.

Example 10 may include the apparatus of Example 9, wherein the control-status register is to be error correction code protected.

Example 11 may include the apparatus of Example 9, wherein the pattern manager is to increment the counter value in response to a power cycle.

Example 12 may include the apparatus of Example 7, wherein the read operation is to be directed to a non-volatile memory structure containing the memory region.

Example 13 may include a method of operating a memory controller apparatus comprising detecting that a read operation is directed to a memory region while the memory region is in a poisoned state, clearing the poisoned state if volatile data stored in the memory region does not correspond to a known data pattern, and maintaining the memory region in the poisoned state if the volatile data stored in the memory region corresponds to the known data pattern.

Example 14 may include the method of Example 13, further including detecting an error associated with a write operation directed to the memory region, setting the poisoned state for the volatile memory region in response to the error, and writing the known data pattern to the memory region.

Example 15 may include the method of any one of Examples 13 or 14, further including generating a counter value, and storing the counter value to a control-status register, wherein the counter value is the known data pattern.

Example 16 may include the method of Example 15, wherein the control-status register is error correction code protected.

Example 17 may include the method of Example 15, further including increment the counter value in response to a power cycle.

Example 18 may include the method of Example 13, wherein the read operation is directed to a non-volatile memory structure containing the memory region.

Example 19 may include at least one non-transitory computer readable storage medium comprising a set of instructions, which when executed by a computing system, cause the computing system to detect that a read operation is directed to a memory region while the memory region is in a poisoned state, clear the poisoned state if volatile data stored in the memory region does not correspond to a known data pattern, and maintain the memory region in the poisoned state if the volatile data stored in the memory region corresponds to the known data pattern.

Example 20 may include the at least one non-transitory computer readable storage medium of Example 19, wherein the instructions, when executed, cause the computing device to detect an error associated with a write operation directed to the memory region, set the poisoned state for the volatile memory region in response to the error, and write the known data pattern to the memory region.

Example 21 may include the at least one non-transitory computer readable storage medium of any one of Examples 19 or 20, wherein the instructions, when executed, cause the computing device to generate a counter value, and store the counter value to a control-status register, wherein the counter value is the known data pattern.

Example 22 may include the at least one non-transitory computer readable storage medium of Example 21, wherein the control-status register is to be error correction code protected.

Example 23 may include the at least one non-transitory computer readable storage medium of Example 21, wherein the instructions, when executed, cause the computing device to increment the counter value in response to a power cycle.

Example 24 may include the at least one non-transitory computer readable storage medium of Example 19, wherein the read operation is to be directed to a non-volatile memory structure containing the memory region.

Example 25 may include a memory controller apparatus comprising means for detecting that a read operation is directed to a memory region while the memory region is in a poisoned state, means for clearing the poisoned state if volatile data stored in the memory region does not correspond to a known data pattern, and means for maintaining the memory region in the poisoned state if the volatile data stored in the memory region corresponds to the known data pattern.

Example 26 may include the apparatus of Example 25, further including means for detecting an error associated with a write operation directed to the memory region, means for setting the poisoned state for the volatile memory region in response to the error, and means for writing the known data pattern to the memory region.

Example 27 may include the apparatus of any one of Examples 25 or 26, further including means for generating a counter value, and means for storing the counter value to a control-status register, wherein the counter value is the known data pattern.

Example 28 may include the apparatus of Example 27, wherein the control-status register is to be error correction code protected.

Example 29 may include the apparatus of Example 27, further means for including increment the counter value in response to a power cycle.

Example 30 may include the apparatus of Example 25, wherein the read operation is to be directed to a non-volatile memory structure containing the memory region.

Techniques described herein may therefore use a unique data pattern that replaces a location's stored data when the location is poisoned during write operations. When a read operation is encountered, if poison is detected in the metadata bits that encode poison and the location's address is in a persistent memory region, the poison state may be maintained without checking the poison pattern. If, on the other hand, the location's address is in a memory region, the memory controller may compare the data with the poison pattern. Thus, the poison state might be maintained only if the comparison indicates a match. In the case of non-matching data and poison pattern, the memory controller may clear the poison state from the returning data.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A system comprising:
a memory structure containing a memory region;
a bus coupled to the memory structure; and
a memory controller apparatus coupled to the bus, the memory controller apparatus including:
a read monitor to detect that a read operation is directed to the memory region while the memory region is in a poisoned state following a reset of the system, and
a state manager to clear the poisoned state if volatile data stored in the memory region does not correspond to a known data pattern and maintain the memory region in the poisoned state if the volatile data stored in the memory region corresponds to the known data pattern.

2. The system of claim 1, wherein the memory controller apparatus further includes:
a write monitor to detect an error associated with a write operation directed to the memory region, wherein the state manager is to set the poisoned state for the memory region in response to the error; and
a substitution manager to write the known data pattern to the memory region.

3. The system of claim 1, further including a control-status register and a pattern manager to generate a counter value and store the counter value to the control-status register, wherein the counter value is the known data pattern.

4. The system of claim 3, wherein the control-status register is error correction code protected.

5. The system of claim 3, wherein the pattern manager is to monotonically increment the counter value in response to a power cycle.

6. The system of claim 1, wherein the memory structure is a non-volatile memory structure.

7. An apparatus comprising:
a read monitor to detect that a read operation is directed to a memory region while the memory region is in a poisoned state following a system reset; and
a state manager to clear the poisoned state if volatile data stored in the memory region does not correspond to a known data pattern and maintain the memory region in the poisoned state if the volatile data stored in the memory region corresponds to the known data pattern.

8. The apparatus of claim 7, further including:
a write monitor to detect an error associated with a write operation directed to the memory region, wherein the state manager is to set the poisoned state for the memory region in response to the error; and
a substitution manager to write the known data pattern to the memory region.

9. The apparatus of claim 7, further including a pattern manager to generate a counter value and store the counter value to a control-status register, wherein the counter value is the known data pattern.

10. The apparatus of claim 9, wherein the control-status register is to be error correction code protected.

11. The apparatus of claim 9, wherein the pattern manager is to monotonically increment the counter value in response to a power cycle.

12. The apparatus of claim 7, wherein the read operation is to be directed to a non-volatile memory structure containing the memory region.

13. A method comprising:
detecting that a read operation is directed to a memory region while the memory region is in a poisoned state following a system reset;
clearing the poisoned state if volatile data stored in the memory region does not correspond to a known data pattern; and
maintaining the memory region in the poisoned state if the volatile data stored in the memory region corresponds to the known data pattern.

14. The method of claim 13, further including:
detecting an error associated with a write operation directed to the memory region;
setting the poisoned state for the memory region in response to the error; and
writing the known data pattern to the memory region.

15. The method of claim 13, further including:
generating a counter value; and
storing the counter value to a control-status register, wherein the counter value is the known data pattern.

16. The method of claim 15, wherein the control-status register is error correction code protected.

17. The method of claim 15, further including monotonically incrementing the counter value in response to a power cycle.

18. The method of claim 13, wherein the read operation is directed to a non-volatile memory structure containing the memory region.

19. At least one non-transitory computer readable storage medium comprising a set of instructions, which when executed by a computing system, cause the computing system to:
detect that a read operation is directed to a memory region while the memory region is in a poisoned state following a reset of the computing system;
clear the poisoned state if volatile data stored in the memory region does not correspond to a known data pattern; and
maintain the memory region in the poisoned state if the volatile data stored in the memory region corresponds to the known data pattern.

20. The at least one non-transitory computer readable storage medium of claim 19, wherein the set of instructions, when executed, cause the computing system to:
detect an error associated with a write operation directed to the memory region;
set the poisoned state for the memory region in response to the error; and
write the known data pattern to the memory region.

21. The at least one non-transitory computer readable storage medium of claim 19, wherein the set of instructions, when executed, cause the computing system to:
generate a counter value; and
store the counter value to a control-status register, wherein the counter value is the known data pattern.

22. The at least one non-transitory computer readable storage medium of claim 21, wherein the control-status register is to be error correction code protected.

23. The at least one non-transitory computer readable storage medium of claim 21, wherein the set of instructions, when executed, cause the computing system to monotonically increment the counter value in response to a power cycle.

24. The at least one non-transitory computer readable storage medium of claim 19, wherein the read operation is to be directed to a non-volatile memory structure containing the memory region.

\* \* \* \* \*